(12) United States Patent
Shi et al.

(10) Patent No.: US 9,673,227 B1
(45) Date of Patent: Jun. 6, 2017

(54) METHOD OF MANUFACTURING TFTS IN SERIES AND CONNECTION SEMICONDUCTOR FORMED THEREBY

(71) Applicant: Shenzhen China Star Optoelectronics Technology Co., Ltd., Shenzhen (CN)

(72) Inventors: Longqiang Shi, Shenzhen (CN); Baixiang Han, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 196 days.

(21) Appl. No.: 14/759,198

(22) PCT Filed: May 25, 2015

(86) PCT No.: PCT/CN2015/079662
§ 371 (c)(1),
(2) Date: Jul. 2, 2015

(87) PCT Pub. No.: WO2016/176880
PCT Pub. Date: Nov. 10, 2016

(30) Foreign Application Priority Data

May 6, 2015 (CN) .......................... 2015 1 0227679

(51) Int. Cl.
*H01L 27/12* (2006.01)
*H01L 21/02* (2006.01)
(Continued)

(52) U.S. Cl.
CPC ...... *H01L 27/124* (2013.01); *H01L 21/02565* (2013.01); *H01L 21/02631* (2013.01);
(Continued)

(58) Field of Classification Search
CPC ..................................................... H01L 27/124
See application file for complete search history.

(56) References Cited

U.S. PATENT DOCUMENTS 5,198,379 A * 3/1993 Adan ................ H01L 29/66477
257/E21.409
5,412,493 A * 5/1995 Kunii .................. G02F 1/13454
257/344

(Continued)

*Primary Examiner* — Evan Pert
(74) *Attorney, Agent, or Firm* — Leong C. Lei (57) ABSTRACT

The present invention provides a method for manufacturing a TFT substrate and a structure thereof. The method for manufacturing the TFT substrate uses a connection semiconductor (42) that is formed in a semiconductor layer and is subjected to N-type heavy doping to connect a first semiconductor (41) and a second semiconductor (43) so as to connect the first TFT and the second TFT in series. The N-type heavily doped connection semiconductor (42) substitutes a connection electrode that is formed in a second metal layer in prior art techniques for preventing the design rules of the connection electrode and the second metal layer from being narrowed due to the connection electrode being collectively present on the second metal layer with signal lines of a data line and a voltage supply line and for facilitating increase of an aperture ratio and definition of a display panel. The present invention also provides a TFT substrate structure, which has a simple structure and possesses a high aperture ratio and high definition.

12 Claims, 7 Drawing Sheets

(51) Int. Cl.
*H01L 29/49* (2006.01)
*H01L 29/786* (2006.01)
*G09G 3/3225* (2016.01)

(52) U.S. Cl.
CPC ........ *H01L 27/127* (2013.01); *H01L 27/1225* (2013.01); *H01L 29/4908* (2013.01); *H01L 29/7869* (2013.01); *G09G 3/3225* (2013.01); *G09G 2300/043* (2013.01); *G09G 2300/0465* (2013.01)

(56) References Cited

U.S. PATENT DOCUMENTS

| | | | | |
|---|---|---|---|---|
| 6,034,748 | A * | 3/2000 | Furuta | H01L 27/1214 257/66 |
| 6,281,552 | B1 * | 8/2001 | Kawasaki | H01L 27/1214 257/344 |
| 7,271,412 | B2 * | 9/2007 | Kwak | H01L 27/1214 257/343 |
| 7,525,125 | B2 * | 4/2009 | Ahn | H01L 51/0545 257/59 |
| 7,696,521 | B2 * | 4/2010 | Lee | G09G 3/3233 257/40 |
| 9,196,737 | B2 * | 11/2015 | Zhan | H01L 29/78672 |
| 9,269,755 | B2 * | 2/2016 | Kim | H01L 27/3262 |
| 2002/0175376 | A1 * | 11/2002 | Ohtani | H01L 29/78648 257/350 |
| 2006/0226427 | A1 * | 10/2006 | Yamasaki | G02F 1/136213 257/59 |
| 2007/0007342 | A1 * | 1/2007 | Cleeves | G06K 19/07749 235/435 |

* cited by examiner

METHOD OF MANUFACTURING TFTS IN SERIES AND CONNECTION SEMICONDUCTOR FORMED THEREBY

BACKGROUND OF THE INVENTION

1. Field of the Invention

The present invention relates to the field of displaying technology, and in particular to a method for manufacturing a thin-film transistor (TFT) substrate and a structure thereof.

2. The Related Arts

In the field of displaying technology, flat panel display technology, such as liquid crystal displays (LCDs) and organic light-emitting diodes (OLEDs), has gradually taken the place of cathode ray tube (CRT) displays, and among them, the OLEDs have various advantages, such as being self-luminous, low driving voltage, high light emission efficiency, short response time, high clarity and contrast, virtually 180° view angle, wide temperature range of applications, being capable of flexible displaying, and full color displaying in a large area, and are considered a display device with the best potential of development.

The OLEDs can be classified, according to the type of driving, as passive OLEDs (such as passive matrix OLEDs (PMOLEDs)) and active OLEDs (such as active matrix OLEDs (AMOLEDs)). An AMOLED device is driven by electrical current and thus has a severe requirement for the electrical current of thin-film transistors. Thus, an AMOLED product must comprise a pixel compensation circuit to reduce current variation resulting from instability of TFT in the entire driving process.

Figure 1:
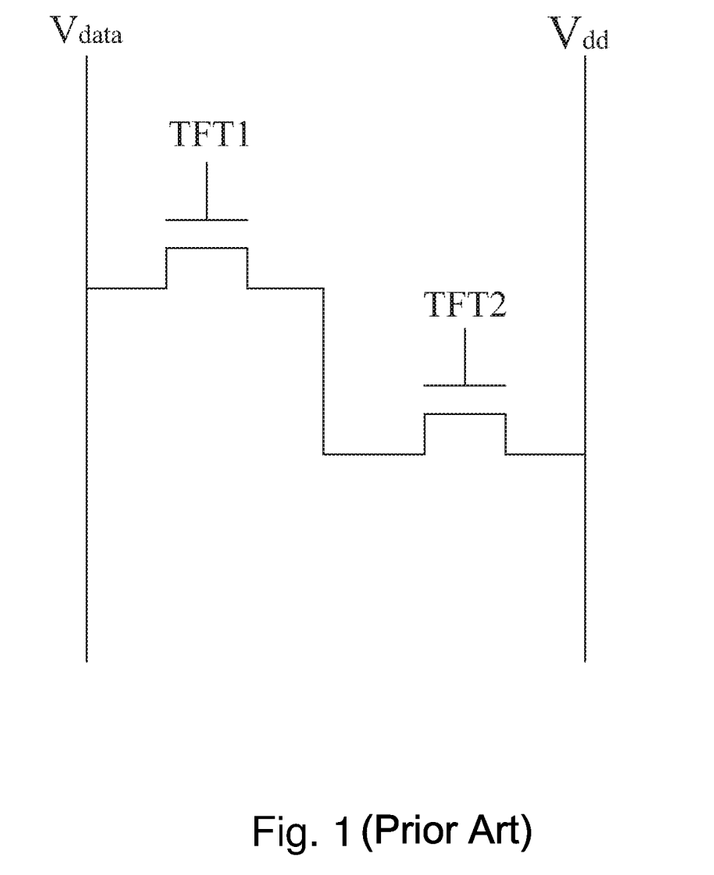
FIG. 1 is a circuit diagram of a conventional pixel compensation circuit.
Figure 2:
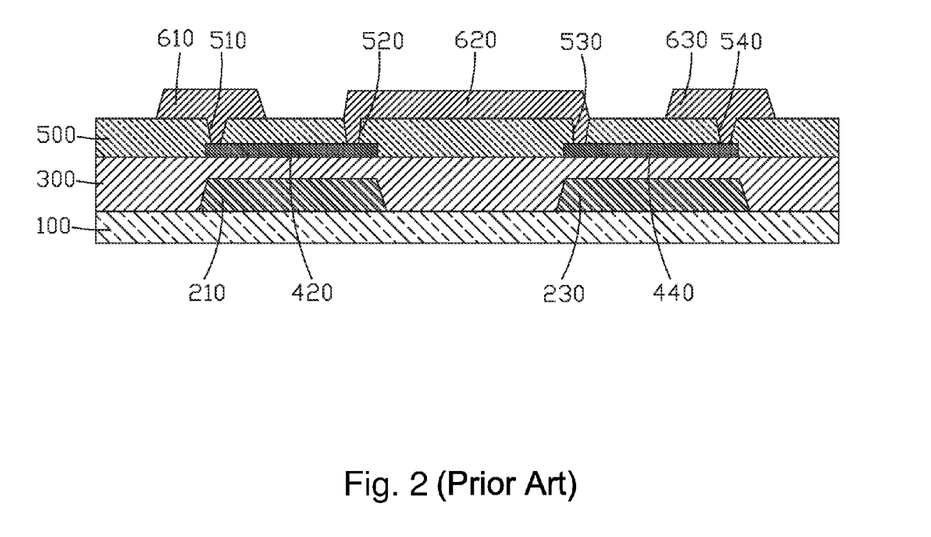
FIG. 2 is a schematic view showing a thin-film transistor (TFT) substrate structure corresponding to the pixel compensation circuit of FIG. 1.
Figure 3:
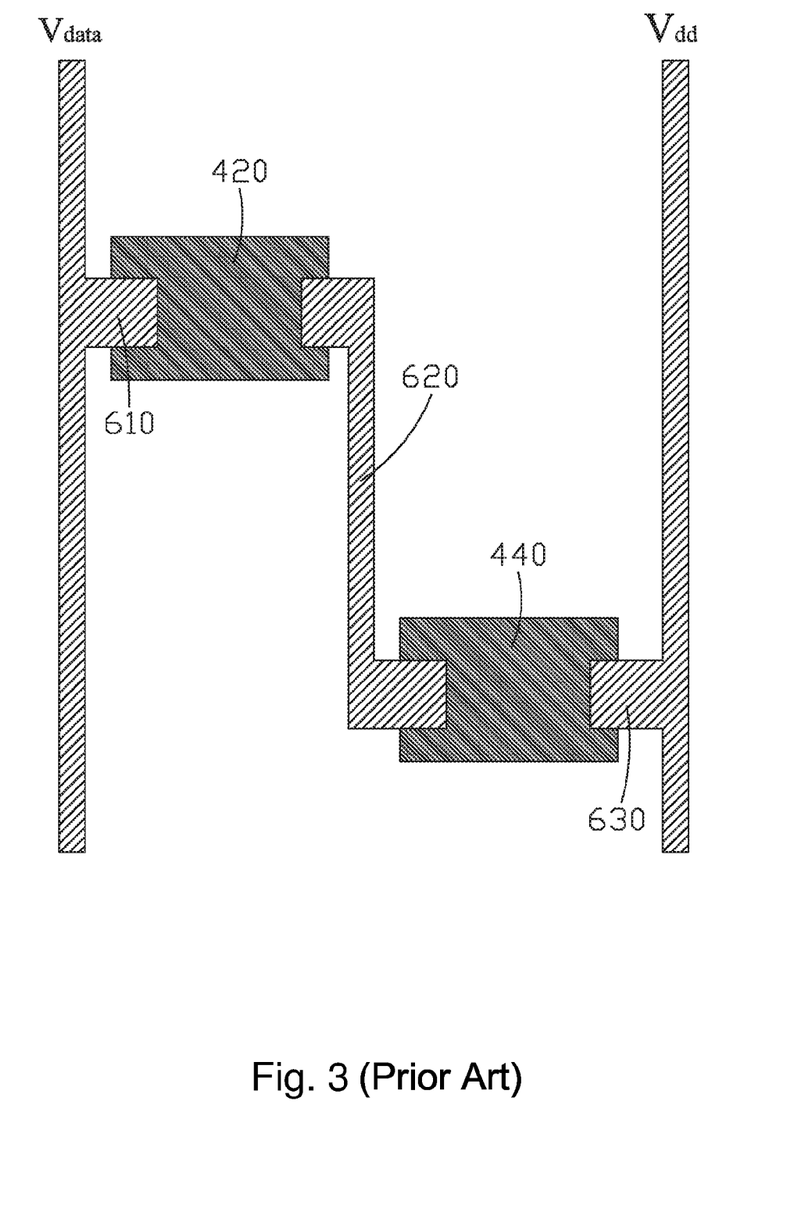
FIG. 3 is a schematic view illustrating the arrangement and connection of TFT components of the TFT substrate structure of FIG. 2 with a data line and a voltage supply line.

A conventional AMOLED pixel compensation circuit often involves multiple TFT connected in series. For example, FIG. 1 illustrates a pixel compensation circuit, which comprises two TFTs, namely TFT1 and TFT2, connected in series between two signal lines that are a data line $V_{data}$ and a voltage supply line $V_{dd}$. FIG. 2 illustrates a TFT substrate structure corresponding to the pixel compensation circuit shown in FIG. 1. FIG. 3 is a schematic view illustrating the arrangement and connection of the TFT components of the TFT substrate structure shown in FIG. 2 with the data line and the voltage supply line.

As shown in FIGS. 2 and 3, the TFT substrate structure comprises, in sequence from bottom to top, a substrate 100, a first metal layer, a gate insulation layer 300, a semiconductor layer, an etch stop layer 500, and a second metal layer. The first metal layer comprises a first gate terminal 210 and a second gate terminal 230 that are spaced from each other. The semiconductor layer comprises a first semiconductor 420 and a second semiconductor 440 that are spaced from each other. The second metal layer comprises a first source terminal 610, a connection electrode 620, and a second drain terminal 630.

The etch stop layer 500 comprises a first through hole 510, a second through hole 520, a third through hole 530, and a fourth through hole 540 formed therein. The first source terminal 610 is set in contact with an end of the first semiconductor 420 via the first through hole 510. The connection electrode 620 is set in contact with an opposite end of the first semiconductor 420 via the second through hole 520 and is also set in contact with an end of the second semiconductor 440 via the third through hole 530. The second drain terminal 630 is set in contact with an opposite end of the second semiconductor 440 via the fourth through hole 540.

The first gate terminal 210, the first semiconductor 420, the first source terminal 610, and the connection electrode 620 collectively form a first TFT; and the second gate terminal 230, the second semiconductor 440, the connection electrode 620, and the second drain terminal 630 collectively form a second TFT.

As shown in FIGS. 2 and 3, the connection electrode 620 simultaneously serves as a first drain terminal for the first TFT and a second source terminal for the second TFT so as to seriously connect the first TFT and the second TFT. However, the second metal layer on which the connection electrode 620 is located also comprises signal lines, such as the data line $V_{data}$ and the voltage supply line $V_{dd}$, the design rule for the connection electrode 620 is very narrow and in addition, the bridging between the two TFT through the connection electrode 620 would further narrow the design rule of the second metal layer and thus making it adverse to the manufacture of a display panel with a high aperture ratio and high definition.

SUMMARY OF THE INVENTION

An object of the present invention is to provide a method for manufacturing a thin-film transistor (TFT) substrate, which uses a connection semiconductor that is arranged on a semiconductor layer and is subjected to heavy N-type doping to replace a connection electrode that is arranged on a second metal layer in the prior art techniques in order to remove the issue of the design rules of the connection electrode and the second metal layer being narrow due to the connection electrode being collectively arranged on the second metal layer with signal lines of data line and voltage supply line and also to facilitate the manufacture of a display panel of high aperture ratio and high definition.

An object of the present invention is also to provide a TFT substrate structure, which has a simple structure and has a high aperture ratio and high definition.

To achieve the above objects, firstly, the present invention provides a method for manufacturing a TFT substrate, which comprises the following steps:

(1) providing a substrate, depositing a first metal layer on the substrate, and applying a photolithographic process to patternize the first metal layer so as to form a first gate terminal and a second gate terminal that are spaced from each other;

(2) depositing a gate insulation layer on the first gate terminal, the second gate terminal, and the substrate;

(3) depositing a semiconductor layer on the gate insulation layer and applying a photolithographic process to patternize the semiconductor layer so as to form a first semiconductor, a connection semiconductor, and a second semiconductor that are arranged in sequence and are successively connected, wherein the first semiconductor is located above and corresponding to the first gate terminal; the second semiconductor is located above and corresponding to the second gate terminal; and the connection semiconductor is located between the first semiconductor and the second semiconductor;

(4) depositing an etch stop layer on the semiconductor layer and applying a photolithographic process to form a first through hole, a second through hole, and a third through hole that are spaced from each other in the etch stop layer, wherein the first through hole, the second through hole, and the third through hole respectively expose an end of the first semiconductor that is distant from the connection semiconductor, the connection semiconductor, and an end of the second semiconductor that is distant from the connection semiconductor;

(5) with the etch stop layer as a shielding layer, applying N-type heavy doping, through the first through hole, the second through hole, and the third through hole, to the end of the first semiconductor that is distant from the connection semiconductor, the connection semiconductor, and the end of the second semiconductor that is distant from the connection semiconductor, so as to form a first source contact zone and a first channel zone in the first semiconductor and to form a second channel zone and a second drain contact zone in the second semiconductor in such a way that opposite ends of the connection semiconductor are respectively connected to the first channel zone and the second channel zone, wherein the first source contact zone, the connection semiconductor, and the second drain contact zone are all N-type heavily doped zones; and (6) depositing a second metal layer on the etch stop layer and applying a photolithographic process to patternize the second metal layer to form a first source terminal and the second drain terminal that are spaced from each other, wherein the first source terminal is set in contact with the first source contact zone via the first through hole; and the second drain terminal is set in contact with the second drain contact zone via the third through hole; and wherein the first gate terminal, the first semiconductor, the first source terminal, and the N-type heavily doped connection semiconductor constitute a first TFT; the second gate terminal, the second semiconductor, the N-type heavily doped connection semiconductor, and the second drain terminal constitute a second TFT; and the first TFT and the second TFT are connected in series through the N-type heavily doped connection semiconductor.

Step (1) uses physical vapor deposition (PVD) to deposit the first metal layer. The first metal layer comprises a material of copper, aluminum, or molybdenum. The photolithographic process of step (1) comprises operations of photoresist application, exposure, development, wet etching, and photoresist removal. Step (2) uses plasma enhanced chemical vapor deposition to deposit the gate insulation layer. The gate insulation layer comprises a material of silicon oxide or silicon nitride.

Step (3) uses physical vapor deposition to deposit the semiconductor layer. The semiconductor layer comprises a material of metal oxides. The photolithographic process of step (3) comprises operations of photoresist application, exposure, development, wet etching, and photoresist removal.

Step (4) uses chemical vapor deposition to deposit the etch stop layer. The etch stop layer comprises a material of silicon oxide or silicon nitride. The photolithographic process of step (4) comprises operations of photoresist application, exposure, development, dry etching, and photoresist removal. Step (5) uses a hydrogen plasma treatment operation to perform N-type heavy doping to the end of the first semiconductor that is distant from the connection semiconductor, the connection semiconductor, and the end of the second semiconductor that is distant from the connection semiconductor.

Step (6) uses physical vapor deposition to deposit the second metal layer. The second metal layer comprises a material of copper, aluminum, or molybdenum. The photolithographic process of step (6) comprises operations of photoresist application, exposure, development, wet etching, and photoresist removal.

The present invention also provides a TFT substrate structure, which comprises, in sequence from bottom to top, a substrate, a first metal layer, a gate insulation layer, a semiconductor layer, an etch stop layer, and a second metal layer, the first metal layer comprising a first gate terminal and a second gate terminal that are spaced from each other, the semiconductor layer comprising a first semiconductor, a connection semiconductor, and a second semiconductor that are arranged in sequence and are successively connected, the second metal layer comprising a first source terminal and a second drain terminal that are spaced from each other;

wherein the first semiconductor is located above and corresponding to the first gate terminal; the second semiconductor is located above and corresponding to the second gate terminal; and the connection semiconductor is located between the first semiconductor and the second semiconductor, the first semiconductor comprising a first source contact zone and a first channel zone, the second semiconductor comprising a second channel zone and a second drain contact zone, the connection semiconductor having opposite ends respectively connected to the first channel zone and the second channel zone, the first source contact zone, the connection semiconductor, and the second drain contact zone being all N-type heavily doped zones;

wherein the etch stop layer comprises a first through hole, a second through hole, and a third through hole formed therein and spaced from each other, the first source terminal being set in contact with the first source contact zone via the first through hole, the second drain terminal being set in contact with the second drain contact zone via the third through hole, the second through hole exposing the connection semiconductor; and wherein the first gate terminal, the first semiconductor, the first source terminal, and the N-type heavily doped connection semiconductor constitute a first TFT; and the second gate terminal, the second semiconductor, the N-type heavily doped connection semiconductor, and the second drain terminal constitute a second TFT, the first TFT and the second TFT being connected in series through the N-type heavily doped connection semiconductor.

The substrate is a glass substrate and the first metal layer comprises a material of copper, aluminum, or molybdenum.

The gate insulation layer comprises a material of silicon oxide or silicon nitride.

The semiconductor layer comprises a material of metal oxides.

The etch stop layer comprises a material of silicon oxide or silicon nitride and the second metal layer comprises a material of copper, aluminum, or molybdenum.

The present invention further provides a TFT substrate structure, which comprises, in sequence from bottom to top, a substrate, a first metal layer, a gate insulation layer, a semiconductor layer, an etch stop layer, and a second metal layer, the first metal layer comprising a first gate terminal and a second gate terminal that are spaced from each other, the semiconductor layer comprising a first semiconductor, a connection semiconductor, and a second semiconductor that are arranged in sequence and are successively connected, the second metal layer comprising a first source terminal and a second drain terminal that are spaced from each other;

wherein the first semiconductor is located above and corresponding to the first gate terminal; the second semiconductor is located above and corresponding to the second gate terminal; and the connection semiconductor is located between the first semiconductor and the second semiconductor, the first semiconductor comprising a first source contact zone and a first channel zone, the second semiconductor comprising a second channel zone and a second drain contact zone, the connection semiconductor having opposite ends respectively connected to the first channel zone and the second channel zone, the first source contact zone, the connection semiconductor, and the second drain contact zone being all N-type heavily doped zones;

wherein the etch stop layer comprises a first through hole, a second through hole, and a third through hole formed therein and spaced from each other, the first source terminal being set in contact with the first source contact zone via the first through hole, the second drain terminal being set in contact with the second drain contact zone via the third through hole, the second through hole exposing the connection semiconductor;

wherein the first gate terminal, the first semiconductor, the first source terminal, and the N-type heavily doped connection semiconductor constitute a first TFT; and the second gate terminal, the second semiconductor, the N-type heavily doped connection semiconductor, and the second drain terminal constitute a second TFT, the first TFT and the second TFT being connected in series through the N-type heavily doped connection semiconductor;

wherein the substrate is a glass substrate and the first metal layer comprises a material of copper, aluminum, or molybdenum;

wherein the gate insulation layer comprises a material of silicon oxide or silicon nitride; and wherein the semiconductor layer comprises a material of metal oxides.

The efficacy of the present invention is that the present invention provides a method for manufacturing a TFT substrate, which uses a connection semiconductor formed in a semiconductor layer and subjected to N-type heavy doping to connect a first semiconductor and a second semiconductor so as to connect a first TFT and a second TFT in series. The N-type heavily doped connection semiconductor substitutes a connection electrode that is formed in a second metal layer in prior art techniques for preventing the design rules of the connection electrode and the second metal layer from being narrowed due to the connection electrode being collectively present on the second metal layer with signal lines of a data line and a voltage supply line and for facilitating increase of an aperture ratio and definition of a display panel. The present invention provides a TFT substrate structure, which has a simple structure and possesses a high aperture ratio and high definition.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will be apparent from the following detailed description of an embodiment of the present invention, with reference to the attached drawing.

In the drawing.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 4:
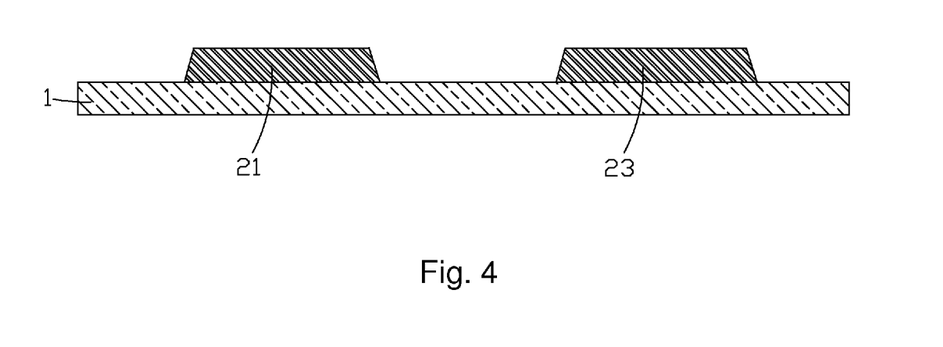
FIG. 4 is a schematic view illustrating a first step of a method for manufacturing a TFT substrate according to the present invention.

Referring to FIGS. 4-9, firstly, the present invention provides a method for manufacturing a thin-film transistor (TFT) substrate, which comprises the following steps:

Step 1: as shown in FIG. 4, providing a substrate 1, depositing a first metal layer on the substrate 1, and applying a photolithographic process to patternize the first metal layer so as to form a first gate terminal 21 and a second gate terminal 23 that are spaced from each other.

Preferably, the substrate 1 is a glass substrate.

Specifically, step 1 uses physical vapor deposition (PVD) to deposit the first metal layer. Preferably, the first metal layer comprises a material of copper, aluminum, or molybdenum.

The photolithographic process comprises operations of photoresist application, exposure, development, wet etching, and photoresist removal.

Figure 5:
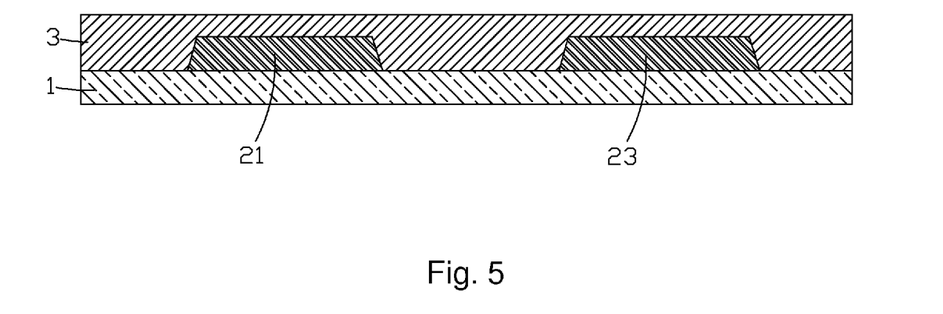
FIG. 5 is a schematic view illustrating a second step of the method for manufacturing the TFT substrate according to the present invention.

Step 2: as shown in FIG. 5, depositing a gate insulation layer 3 on the first gate terminal 21, the second gate terminal 23, and the substrate 1.

Specifically, step 2 uses plasma enhanced chemical vapor deposition (PECVD) to deposit the gate insulation layer 3. Preferably, the gate insulation layer 3 comprises a material of silicon oxide or silicon nitride.

Figure 6:
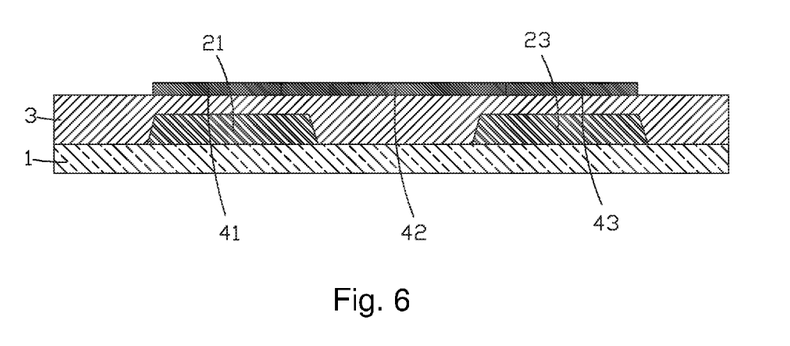
FIG. 6 is a schematic view illustrating a third step of the method for manufacturing the TFT substrate according to the present invention.

Step 3: as shown in FIG. 6, depositing a semiconductor layer on the gate insulation layer 3 and applying a photolithographic process to patternize the semiconductor layer so as to form a first semiconductor 41, a connection semiconductor 42, and a second semiconductor 43 that are arranged in sequence and are successively connected.

The first semiconductor 41 is located above and corresponding to the first gate terminal 21; the second semiconductor 43 is located above and corresponding to the second gate terminal 23; and the connection semiconductor 42 is located between the first semiconductor 41 and the second semiconductor 43.

Specifically, step 3 uses PVD to deposit the semiconductor layer. Further, the semiconductor layer comprises a material of metal oxides. Preferably, the metal oxides are indium gallium zinc oxide (IGZO).

The photolithographic process comprises operations of photoresist application, exposure, development, wet etching, and photoresist removal.

Figure 7:
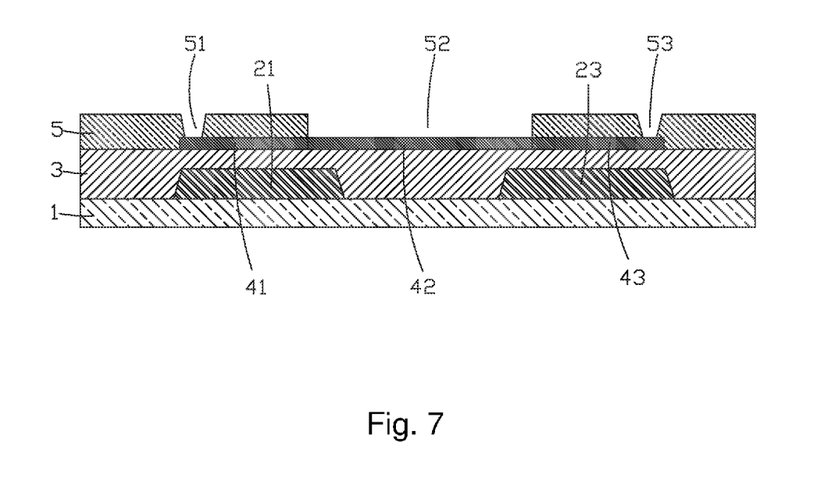
FIG. 7 is a schematic view illustrating a fourth step of the method for manufacturing the TFT substrate according to the present invention.

Step 4: as shown in FIG. 7, depositing an etch stop layer 5 on the semiconductor layer and applying a photolithographic process to form a first through hole 51, a second through hole 52, and a third through hole 53 that are spaced from each other in the etch stop layer 5.

The first through hole 51, the second through hole 52, and the third through hole 53 respectively expose an end of the first semiconductor 41 that is distant from the connection semiconductor 42, the connection semiconductor 42, and an end of the second semiconductor 43 that is distant from the connection semiconductor 42.

Specifically, step 4 uses chemical vapor deposition (CVD) to deposit the etch stop layer 5. Preferably, the etch stop layer 5 comprises a material of silicon oxide or silicon nitride.

The photolithographic process comprises operations of photoresist application, exposure, development, dry etching, and photoresist removal.

Figure 8:
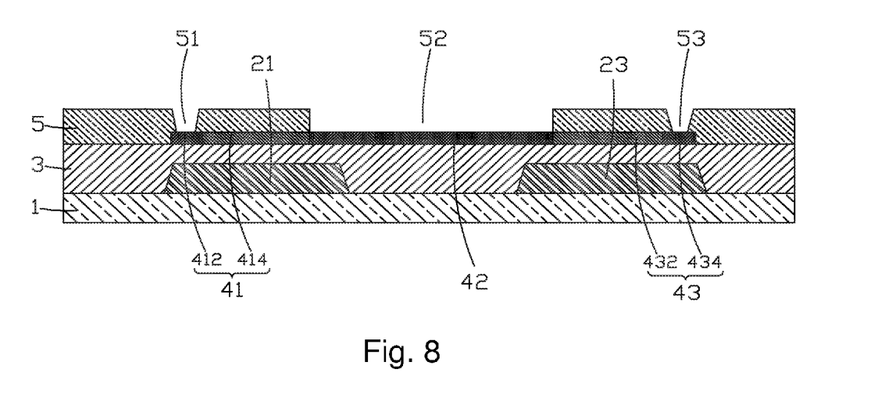
FIG. 8 is a schematic view illustrating a fifth step of the method for manufacturing the TFT substrate according to the present invention.

Step 5: as shown in FIG. 8, with the etch stop layer 5 as a shielding layer, applying N-type heavy doping, through the first through hole 51, the second through hole 52, and the third through hole 53, to the end of the first semiconductor 41 that is distant from the connection semiconductor 42, the connection semiconductor 42, and the end of the second semiconductor 43 that is distant from the connection semiconductor 42 in order to increase electrical conduction capabilities of the end of the first semiconductor 41 that is distant from the connection semiconductor 42, the connection semiconductor 42, and the end of the second semiconductor 43 that is distant from the connection semiconductor 42 thereby forming a first source contact zone 412 and a first channel zone 414 in the first semiconductor 41 and forming a second channel zone 432 and a second drain contact zone 434 in the second semiconductor 43 in such a way that opposite ends of the connection semiconductor 42 are respectively connected to the first channel zone 414 and the second channel zone 432.

The first source contact zone 412, the connection semiconductor 42, and the second drain contact zone 434 are all N-type heavily doped zones.

Preferably, step 5 uses a hydrogen plasma treatment operation to perform N-type heavy doping of the end of the first semiconductor 41 that is distant from the connection semiconductor 42, the connection semiconductor 42, and the end of the second semiconductor 43 that is distant from the connection semiconductor 42.

Figure 9:
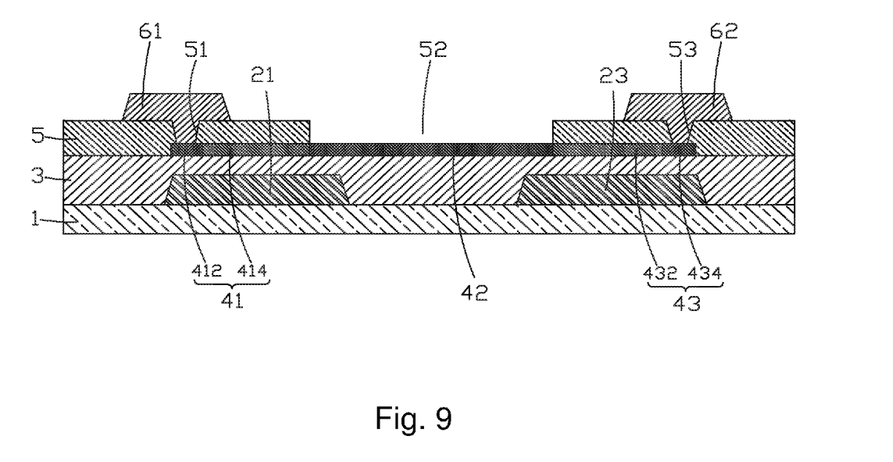
FIG. 9 is a schematic view illustrating a sixth step of the method for manufacturing the TFT substrate according to the present invention and also illustrates a cross-sectional view of the TFT substrate structure according to the present invention.

Step 6: as shown in FIG. 9, depositing a second metal layer on the etch stop layer 5 and applying a photolithographic process to patternize the second metal layer to form a first source terminal 61 and the second drain terminal 62 that are spaced from each other.

The first source terminal 61 is set in contact with the first source contact zone 412 via the first through hole 51; and the second drain terminal 62 is set in contact with the second drain contact zone 434 via the third through hole 53.

The first gate terminal 21, the first semiconductor 41, the first source terminal 61, and the N-type heavily doped connection semiconductor 42 constitute a first TFT; and the second gate terminal 23, the second semiconductor 43, the N-type heavily doped connection semiconductor 42, and the second drain terminal 62 constitute a second TFT. The first TFT and the second TFT are connected in series through the N-type heavily doped connection semiconductor 42.

Specifically, step 6 uses PVD to deposit the second metal layer. Preferably, the second metal layer comprises a material of copper, aluminum, or molybdenum.

The photolithographic process comprises operations of photoresist application, exposure, development, wet etching, and photoresist removal.

The above-described method for manufacturing a TFT substrate forms a connection semiconductor 42 that is subjected to N-type heavy doping in a semiconductor layer and uses the N-type heavily doped connection semiconductor 42 to connect a first semiconductor 41 and a second semiconductor 43 so as to connect the first TFT and the second TFT to each other for substituting a connection electrode that is formed in a second metal layer in prior art techniques for preventing the design rules of the connection electrode and the second metal layer from being narrowed due to the connection electrode being collectively present on the second metal layer with signal lines of a data line and a voltage supply line and for facilitating increase of an aperture ratio and definition of a display panel.

Figure 10:
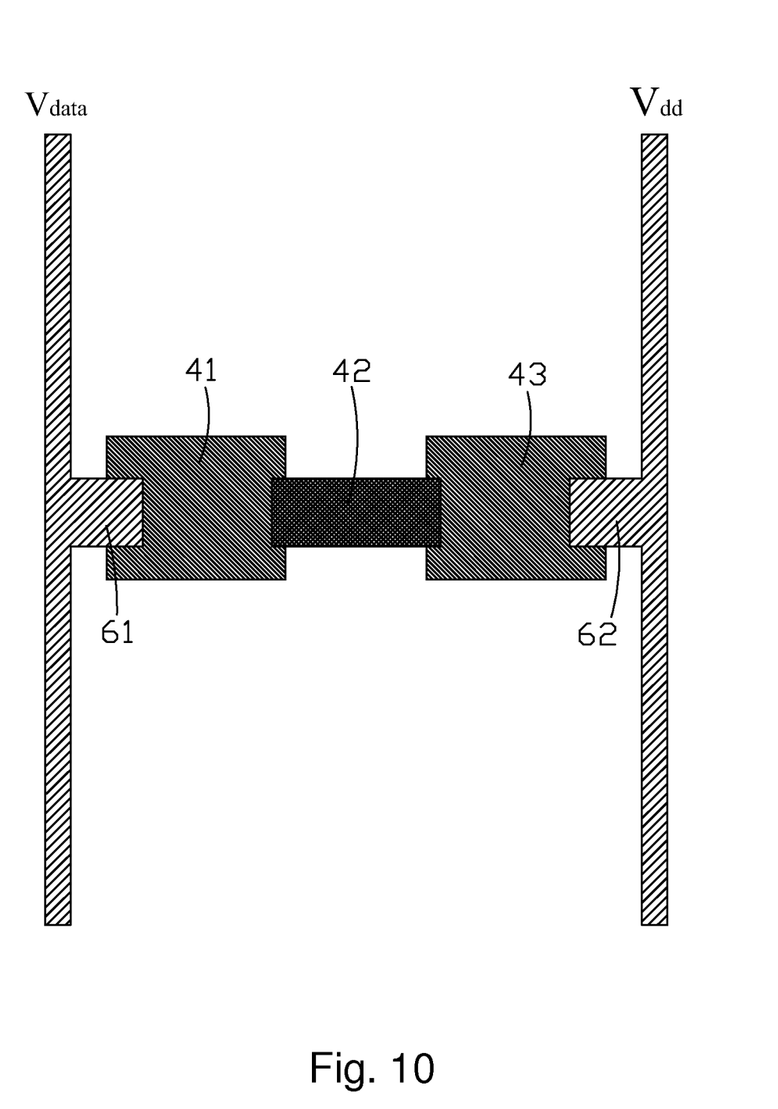
FIG. 10 is a schematic view illustrating the arrangement and connection of TFT components of the TFT substrate structure of FIG. 9 with a data line and a voltage supply line.

Referring to FIGS. 9 and 10, the present invention also provides a TFT substrate structure manufactured with the above-described method, which comprises, in sequence from bottom to top, a substrate 1, a first metal layer, a gate insulation layer 3, a semiconductor layer, an etch stop layer 5, and a second metal layer. The first metal layer comprises a first gate terminal 21 and a second gate terminal 23 that are spaced from each other. The semiconductor layer comprises a first semiconductor 41, a connection semiconductor 42, and a second semiconductor 43 that are arranged in sequence and are successively connected. The second metal layer comprises a first source terminal 61 and a second drain terminal 62 that are spaced from each other.

The first semiconductor 41 is located above and corresponding to the first gate terminal 21; the second semiconductor 43 is located above and corresponding to the second gate terminal 23; and the connection semiconductor 42 is located between the first semiconductor 41 and the second semiconductor 43. The first semiconductor 41 comprises a first source contact zone 412 and a first channel zone 414. The second semiconductor 43 comprises a second channel zone 432 and a second drain contact zone 434. The connection semiconductor 42 has opposite ends respectively connected to the first channel zone 414 and the second channel zone 432. The first source contact zone 412, the connection semiconductor 42, and the second drain contact zone 434 are all N-type heavily doped zones.

The etch stop layer 5 comprises a first through hole 51, a second through hole 52, and a third through hole 53 formed therein and spaced from each other. The first source terminal 61 is set in contact with the first source contact zone 412 via the first through hole 51. The second drain terminal 62 is set in contact with the second drain contact zone 434 via the third through hole 53. The second through hole 52 exposes the connection semiconductor 42.

The first gate terminal 21, the first semiconductor 41, the first source terminal 61, and the N-type heavily doped connection semiconductor 42 constitute a first TFT; and the second gate terminal 23, the second semiconductor 43, the N-type heavily doped connection semiconductor 42, and the second drain terminal 62 constitute a second TFT. The first TFT and the second TFT are connected in series through the N-type heavily doped connection semiconductor 42.

Preferably, the substrate 1 is a glass substrate.

Preferably, the first metal layer comprises a material of copper, aluminum, or molybdenum.

Preferably, the gate insulation layer 3 comprises a material of silicon oxide or silicon nitride.

Preferably, the semiconductor layer comprises a material of metal oxides, such as IGZO.

Preferably, the etch stop layer 5 comprises a material of silicon oxide or silicon nitride.

Preferably, the second metal layer comprises a material of copper, aluminum, or molybdenum.

In summary, the present invention provides a method for manufacturing a TFT substrate, which uses a connection semiconductor formed in a semiconductor layer and subjected to N-type heavy doping to connect a first semiconductor and a second semiconductor so as to connect a first TFT and a second TFT in series. The N-type heavily doped connection semiconductor substitutes a connection electrode that is formed in a second metal layer in prior art techniques for preventing the design rules of the connection electrode and the second metal layer from being narrowed due to the connection electrode being collectively present on the second metal layer with signal lines of a data line and a voltage supply line and for facilitating increase of an aperture ratio and definition of a display panel. The present invention provides a TFT substrate structure, which has a simple structure and possesses a high aperture ratio and high definition.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for manufacturing a thin-film transistor (TFT) substrate, comprising the following steps:
   (1) providing a substrate, depositing a first metal layer on the substrate, and applying a photolithographic process to patternize the first metal layer so as to form a first gate terminal and a second gate terminal that are spaced from each other;
   (2) depositing a gate insulation layer on the first gate terminal, the second gate terminal, and the substrate;
   (3) depositing a semiconductor layer on the gate insulation layer and applying a photolithographic process to patternize the semiconductor layer into a patterned semiconductor layer having a first semiconductor, a connection semiconductor, and a second semiconductor that are arranged in sequence and are contiguously connected,
   wherein the first semiconductor is located above and corresponding to the first gate terminal; the second semiconductor is located above and corresponding to the second gate terminal; and the connection semiconductor is located between the first semiconductor and the second semiconductor;
   (4) depositing an etch stop layer on the semiconductor layer and applying a photolithographic process to form a first through hole, a second through hole, and a third through hole that are spaced from each other in the etch stop layer,
   wherein the first through hole, the second through hole, and the third through hole respectively expose an end of the first semiconductor that is distant from the connection semiconductor, the connection semiconductor, and an end of the second semiconductor that is distant from the connection semiconductor;
   (5) with the etch stop layer as a shielding layer, applying N-type heavy doping, through the first through hole, the second through hole, and the third through hole, to the end of the first semiconductor that is distant from the connection semiconductor, the connection semiconductor, and the end of the second semiconductor that is distant from the connection semiconductor, so as to form a first source contact zone and a first channel zone in the first semiconductor and to form a second channel zone and a second drain contact zone in the second semiconductor in such a way that opposite ends of the connection semiconductor are respectively connected to the first channel zone and the second channel zone, wherein the first source contact zone, the connection semiconductor, and the second drain contact zone are all N-type heavily doped zones; and
   (6) depositing a second metal layer on the etch stop layer and applying a photolithographic process to patternize the second metal layer to form a first source terminal and the second drain terminal that are spaced from each other,
   wherein the first source terminal is set in contact with the first source contact zone via the first through hole; and the second drain terminal is set in contact with the second drain contact zone via the third through hole; and
   wherein the first gate terminal, the first semiconductor, the first source terminal, and the N-type heavily doped connection semiconductor constitute a first TFT; the second gate terminal, the second semiconductor, the N-type heavily doped connection semiconductor, and the second drain terminal constitute a second TFT; and the first TFT and the second TFT are connected in series through the N-type heavily doped connection semiconductor.

2. The method for manufacturing the TFT substrate as claimed in claim 1, wherein step (1) uses physical vapor deposition (PVD) to deposit the first metal layer, the first metal layer comprising a material of copper, aluminum, or molybdenum, the photolithographic process of step (1) comprising operations of photoresist application, exposure, development, wet etching, and photoresist removal; and step (2) uses plasma enhanced chemical vapor deposition to deposit the gate insulation layer, the gate insulation layer comprising a material of silicon oxide or silicon nitride.

3. The method for manufacturing the TFT substrate as claimed in claim 1, wherein step (3) uses physical vapor deposition to deposit the semiconductor layer, the semiconductor layer comprising a material of metal oxides, the photolithographic process of step (3) comprising operations of photoresist application, exposure, development, wet etching, and photoresist removal.

4. The method for manufacturing the TFT substrate as claimed in claim 1, wherein step (4) uses chemical vapor deposition to deposit the etch stop layer, the etch stop layer comprising a material of silicon oxide or silicon nitride, the photolithographic process of step (4) comprising operations of photoresist application, exposure, development, dry etching, and photoresist removal; step (5) uses a hydrogen plasma treatment operation to perform N-type heavy doping to the end of the first semiconductor that is distant from the connection semiconductor, the connection semiconductor, and the end of the second semiconductor that is distant from the connection semiconductor.

5. The method for manufacturing the TFT substrate as claimed in claim 1, wherein step (6) uses physical vapor deposition to deposit the second metal layer, the second metal layer comprising a material of copper, aluminum, or molybdenum, the photolithographic process of step (6) comprising operations of photoresist application, exposure, development, wet etching, and photoresist removal.

6. A thin-film transistor (TFT) substrate structure, comprising, in sequence from bottom to top, a substrate, a first metal layer, a gate insulation layer, a semiconductor layer, an etch stop layer, and a second metal layer, the first metal layer comprising a first gate terminal and a second gate terminal that are spaced from each other, the semiconductor layer comprising a first semiconductor, a connection semiconductor, and a second semiconductor that are arranged in sequence and are successively connected, the second metal layer comprising a first source terminal and a second drain terminal that are spaced from each other;

wherein the first semiconductor is located above and corresponding to the first gate terminal; the second semiconductor is located above and corresponding to the second gate terminal; and the connection semiconductor is located between the first semiconductor and the second semiconductor, the first semiconductor comprising a first source contact zone and a first channel zone, the second semiconductor comprising a second channel zone and a second drain contact zone, the connection semiconductor having opposite ends respectively connected to the first channel zone and the second channel zone, the first source contact zone, the connection semiconductor, and the second drain contact zone being all N-type heavily doped zones;

wherein the etch stop layer comprises a first through hole, a second through hole, and a third through hole formed therein and spaced from each other, the first source terminal being set in contact with the first source contact zone via the first through hole, the second drain terminal being set in contact with the second drain contact zone via the third through hole, the second through hole exposing the connection semiconductor; and wherein the first gate terminal, the first semiconductor, the first source terminal, and the N-type heavily doped connection semiconductor constitute a first TFT; and the second gate terminal, the second semiconductor, the N-type heavily doped connection semiconductor, and the second drain terminal constitute a second TFT, the first TFT and the second TFT being connected in series through the N-type heavily doped connection semiconductor.

7. The TFT substrate structure as claimed in claim 6, wherein the substrate is a glass substrate and the first metal layer comprises a material of copper, aluminum, or molybdenum.

8. The TFT substrate structure as claimed in claim 6, wherein the gate insulation layer comprises a material of silicon oxide or silicon nitride.

9. The TFT substrate structure as claimed in claim 6, wherein the semiconductor layer comprises a material of metal oxides.

10. The TFT substrate structure as claimed in claim 6, wherein the etch stop layer comprises a material of silicon oxide or silicon nitride and the second metal layer comprises a material of copper, aluminum, or molybdenum.

11. A thin-film transistor (TFT) substrate structure, comprising, in sequence from bottom to top, a substrate, a first metal layer, a gate insulation layer, a semiconductor layer, an etch stop layer, and a second metal layer, the first metal layer comprising a first gate terminal and a second gate terminal that are spaced from each other, the semiconductor layer comprising a first semiconductor, a connection semiconductor, and a second semiconductor that are arranged in sequence and are successively connected, the second metal layer comprising a first source terminal and a second drain terminal that are spaced from each other;

wherein the first semiconductor is located above and corresponding to the first gate terminal; the second semiconductor is located above and corresponding to the second gate terminal; and the connection semiconductor is located between the first semiconductor and the second semiconductor, the first semiconductor comprising a first source contact zone and a first channel zone, the second semiconductor comprising a second channel zone and a second drain contact zone, the connection semiconductor having opposite ends respectively connected to the first channel zone and the second channel zone, the first source contact zone, the connection semiconductor, and the second drain contact zone being all N-type heavily doped zones;

wherein the etch stop layer comprises a first through hole, a second through hole, and a third through hole formed therein and spaced from each other, the first source terminal being set in contact with the first source contact zone via the first through hole, the second drain terminal being set in contact with the second drain contact zone via the third through hole, the second through hole exposing the connection semiconductor;

wherein the first gate terminal, the first semiconductor, the first source terminal, and the N-type heavily doped connection semiconductor constitute a first TFT; and the second gate terminal, the second semiconductor, the N-type heavily doped connection semiconductor, and the second drain terminal constitute a second TFT, the first TFT and the second TFT being connected in series through the N-type heavily doped connection semiconductor;

wherein the substrate is a glass substrate and the first metal layer comprises a material of copper, aluminum, or molybdenum;

wherein the gate insulation layer comprises a material of silicon oxide or silicon nitride; and wherein the semiconductor layer comprises a material of metal oxides.

12. The TFT substrate structure as claimed in claim 11, wherein the etch stop layer comprises a material of silicon oxide or silicon nitride and the second metal layer comprises a material of copper, aluminum, or molybdenum.

* * * * *